(12) United States Patent
Lin et al.

(10) Patent No.: US 9,331,081 B2
(45) Date of Patent: May 3, 2016

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chun-Ming Lin, Taichung (TW); Chiu-Hua Chung, Hsinchu (TW); Yu-Shine Lin, Hsinchu County (TW); Bor-Wen Lai, Hsinchu County (TW); Tsung-Lin Lee, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 34 days.

(21) Appl. No.: 14/068,646

(22) Filed: Oct. 31, 2013

(65) Prior Publication Data

US 2015/0115367 A1    Apr. 30, 2015

(51) Int. Cl.
| | |
|---|---|
| *H01L 21/76* | (2006.01) |
| *H01L 21/82* | (2006.01) |
| *H01L 27/092* | (2006.01) |
| *H01L 29/66* | (2006.01) |
| *H01L 21/8238* | (2006.01) |

(52) U.S. Cl.
CPC .... *H01L 27/0928* (2013.01); *H01L 21/823807* (2013.01); *H01L 21/823814* (2013.01); *H01L 21/823892* (2013.01); *H01L 27/092* (2013.01); *H01L 29/66681* (2013.01)

(58) Field of Classification Search
CPC ......... H01L 27/09; H01L 29/66; H01L 21/76; H01L 21/82

USPC ......... 438/218, 224, 424, 250, 302, 294, 433; 257/194, 369, 329, 374, 510, E21.54
See application file for complete search history.

(56) References Cited

U.S. PATENT DOCUMENTS

| | | | | |
|---|---|---|---|---|
| 4,578,859 | A * | 4/1986 | Hause et al. | 438/526 |
| 4,599,789 | A * | 7/1986 | Gasner | 438/224 |
| 6,265,259 | B1 * | 7/2001 | Wu | 438/232 |
| 6,368,937 | B1 * | 4/2002 | Nakamura | 438/401 |
| 6,620,679 | B1 * | 9/2003 | Tzeng et al. | 438/250 |
| 2003/0164527 | A1 * | 9/2003 | Sugi et al. | 257/401 |
| 2004/0262695 | A1 * | 12/2004 | Steegan et al. | 257/371 |
| 2005/0118768 | A1 * | 6/2005 | Chen | 438/301 |
| 2006/0226506 | A1 * | 10/2006 | Jin | 257/510 |
| 2006/0240636 | A1 * | 10/2006 | Ryu et al. | 438/424 |
| 2008/0230843 | A1 * | 9/2008 | Zhang et al. | 257/374 |

(Continued)

*Primary Examiner* — Robert Bachner
*Assistant Examiner* — Sheikh Maruf
(74) *Attorney, Agent, or Firm* — WPAT, P.C., Intellectual Property Attorneys; Anthony King

(57) ABSTRACT

The present disclosure provides a method of manufacturing a semiconductor structure. The method includes forming a first mask on a substrate; defining a first doped region through an opening of the first mask; forming a second mask on the first mask and filling in the opening of the first mask with the second mask; defining a second doped region through an opening of the second mask; and stripping the first mask and the second mask from the substrate. The present disclosure provides a semiconductor structure, including a substrate having a top surface; a first doped region having a first surface; and a second doped region having a second surface. The first surface and the second surface are coplanar with the top surface of the substrate. Either of the doped regions has a monotonically decreasing doping profile from the top surface of the substrate to a bottom of the doped region.

20 Claims, 18 Drawing Sheets

(56) References Cited

U.S. PATENT DOCUMENTS

2013/0161730 A1* 6/2013 Pan et al. .................. 257/329
2014/0024191 A1* 1/2014 Chen et al. ................. 438/294

* cited by examiner

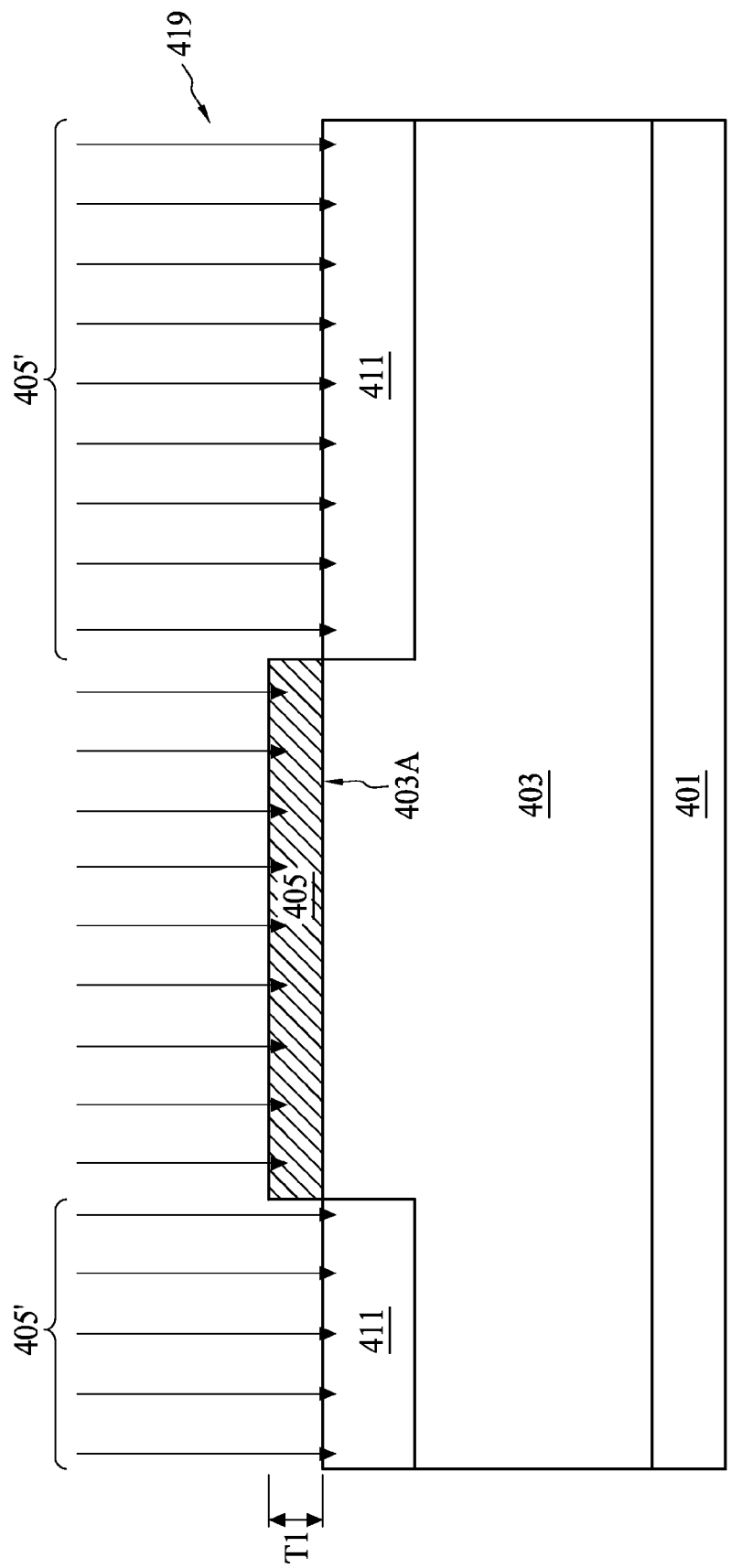

SEMICONDUCTOR STRUCTURE AND MANUFACTURING METHOD THEREOF

FIELD

The present disclosure relates to a doped semiconductor structure and the manufacturing method thereof.

BACKGROUND

Ion implantation is a standard technique for introducing conductivity-altering impurities into substrates. A precise doping profile in a substrate and associated thin film structure is critical for proper device performance. Generally, a desired impurity material (i.e. dopant) is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity. The energetic ions bombardment damages the single-crystal structure of the substrate material after the ion implantation. A high-temperature (more than 1000 degrees Celsius) annealing process is required to repair the damage and to activate the dopant.

Ion implantation can independently control both dopant concentration and junction depth. Dopant concentration can be controlled by the combination of ion beam current and implantation time, and junction depth can be controlled by the ion energy. Ion implantation is a high vacuum process, and a thick layer of photoresist can block the energetic dopants ions. Ion implantation can use photoresist as the patterning mask and does not need to grow and etch silicon dioxide to form the hard mask as the diffusion doping process does.

The mass analyzer of an implanter selects exactly the ion species needed for implantation and generates a pure ion beam; thus ion implantation has less possibility for contamination, the ion implantation process always operates in a high vacuum, an inherently clean environment, and is an anisotropic process. Dopant ions are implanted into the silicon mainly in the vertical direction, and the doped region closely reflects the area defined by photoresist mask.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4A to FIG. 4E are a method for manufacturing a semiconductor structure with a P-well and an N-well according to some embodiments of the present disclosure;

DETAILED DESCRIPTION OF THE INVENTION

Figure 1:
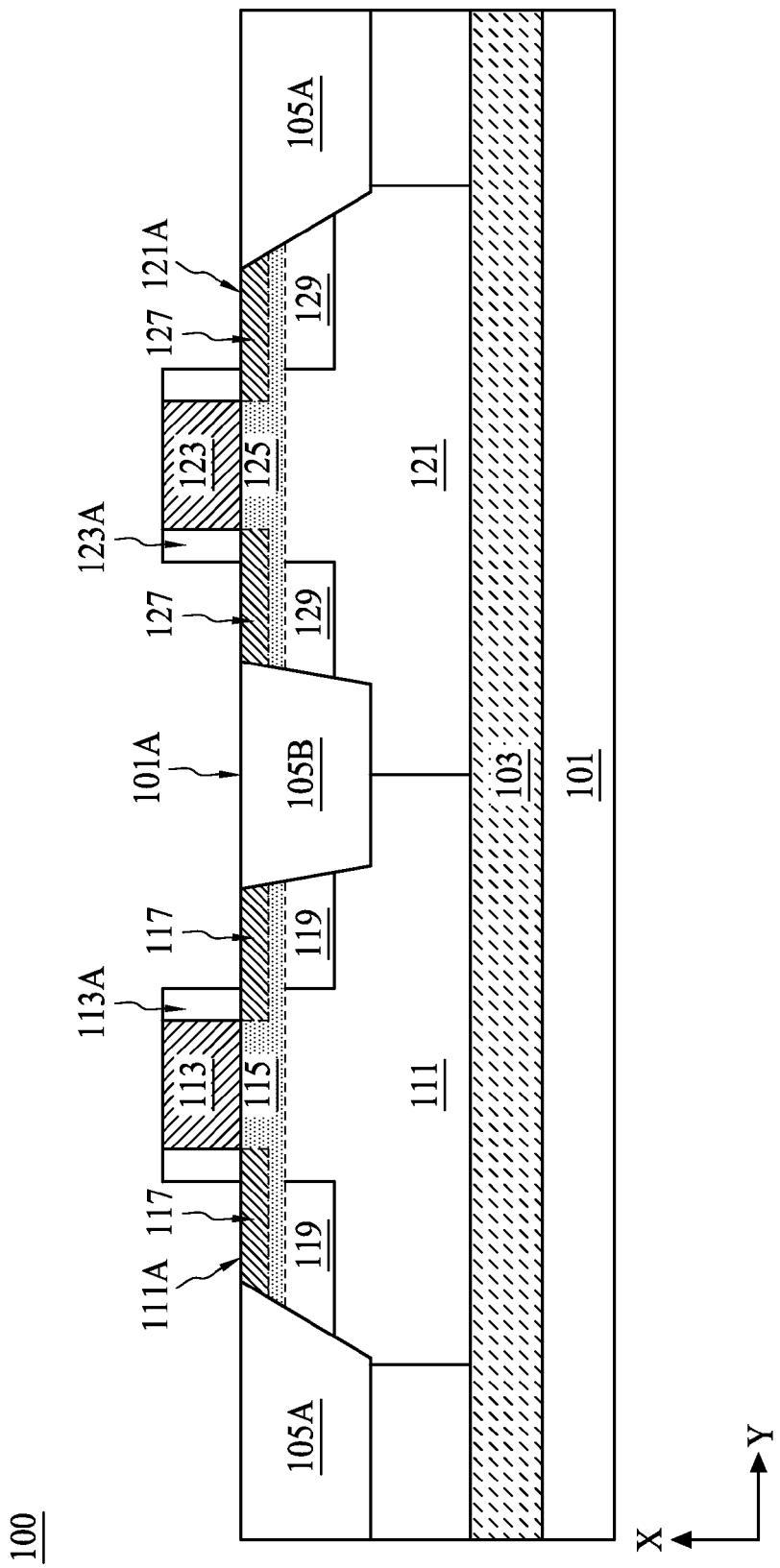
FIG. 1 is a cross sectional view of a semiconductor structure according to some embodiments of the present disclosure.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the preferred embodiments. Accordingly, the invention expressly should not be limited to such preferred embodiments illustrating some possible non-limiting combination of features that may exist alone or in other combinations of features; the scope of the invention being defined by the claims appended hereto.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

In a complementary MOS (CMOS) fabrication scheme, a doped region of a first conductive type in NMOS and another doped region of a second conductive type in PMOS is often accomplished using ion implantation. Ion implantation and rapid thermal annealing (RTA) system can be found in an implant bay in an IC fab. The former is an adding process in which dopants such as As, B, P, and Sb are added to the semiconductor substrate to change its conductivity. RTA is a heating process that repairs the lattice damage to the substrate at high temperature while neither removing nor adding materials on the wafer surface.

In order to create two doped regions with opposite conductive types, photolithography operation is adopted to open implantation windows at predetermined regions in the substrate. For example, in order to obtain a P-doped profile region in the substrate, a first mask layer shall cover an area other than the predetermined P-doped profile region, and ion beams having appropriate ion accelerating voltage and dosage then strike the surface of the substrate through the defined openings in the first mask layer. A proper RTA is then followed to complete a dopant drive-in operation. Before forming an N-doped profile region in the same substrate, the first mask shall be stripped using a wet stripping operation, a dry stripping operation, or both, in order to completely and thoroughly remove the first mask layer to ensure the cleanness of the following steps.

Following the above stripping operation, a second mask layer is patterned to expose an N-doped profile region. Repeatedly, ion beams having appropriate ion accelerating voltage and dosage then strike the surface of the substrate through the opening in the second mask layer, and an appropriate RTA follows. Note that both the openings in the first mask layer and the second mask layer directly expose the predetermined doping profile region in the substrate. In other words, the ion beams penetrate through the target substrate without any masking barrier other than the substrate itself. Prior subjecting to any further fabrication step, the second mask layer is removed or stripped using a same or a different stripping recipe as that used for stripping the first mask layer.

Removing the mask layers is usually the last step of the patterning technique or the selective treatment. It requires that the mask layers be completely and thoroughly removed to ensure the cleanness of the following steps. In the cases where photoresist is used as a mask layer, normally an oxygen-containing ashing procedure is mostly used to carry out a dry photoresist strip (dry PR strip), which uses an oxygen plasma to react with the photoresist material that is basically composed of hydrocarbons to remove it.

Another method which uses a sulfuric-peroxide mix liquid (SPM) of high temperature is used. The sulfuric acid and the peroxide form Caro's acid to completely oxidize the photoresist material that is basically composed of organic compounds. This is called a wet photoresist strip (wet PR strip).

In the method described above, total two mask layers are patterned and two stripping operations are carried out. To ensure a complete stripping effect, both the dry PR strip and the wet PR strip are used, accumulating a fabrication cost higher than that manufacturing a single NMOS or a single PMOS, where only one mask layer is required to be removed.

Some embodiments in the present disclosure provide a method of manufacturing a CMOS, in which two regions of opposite conductive types are formed using one mask stripping operation. In some embodiments, P-type dopants are implanted into a predetermined P-doped profile region through the openings of the first mask layer. Without stripping the first mask layer, the second mask layer is overlaid on the first mask layer, and N-type dopants are implanted into a predetermined N-doped profile region through the openings of the second mask layer. Prior subjecting to any further fabrication step, the first mask layer and the second mask layer is stripped in one single stripping operation.

In some embodiments, the method discussed herein adopting a dosage lower than $1E14$ atoms/cm$^2$ to form an N-doped profile region and a P-doped profile region. In other embodiments, the method discussed herein can be used both in a pre-gate implantation and a post-gate implantation.

Some embodiments of the present disclosure provide a semiconductor structure manufactured using the method discussed herein. The semiconductor structure includes an N-doped profile region and a P-doped profile region. Both the N- and P-doped profile regions have monotonically decreasing doping profiles starting from the top surface of the substrate to a bottom of the N- and P-doped profile regions, respectively.

In describing and claiming the present disclosure, the following terminology will be used in accordance with the definitions set forth below.

As used herein, "projected range" refers to a dopant junction depth. Generally, the higher the ion energy, the deeper it can penetrate into the substrate. However even with the same implantation energy ions do not stop exactly at the same depth in the substrate because each ion has different collisions with different atoms. In some embodiments of the present disclosure, the projected range has a distribution, and the maximum of said distribution is the specific dopant junction depth the projected range refers to.

As used herein, "Gaussian distribution doping profile" refers to a doping concentration distribution in a direction perpendicular to the substrate surface following a Gaussian distribution profile. In some embodiments, the doping concentration distribution shows a portion of the Gaussian distribution curve.

As used herein, "monotonically decreasing doping profile" refers to a doping concentration decreases monotonically from the surface of the substrate to the bottom of the doped region. In some embodiments, the bottom of the doped region situated in the substrate.

As used herein, "Secondary ion mass spectrometry (SIMS)" refers to a technique used for surface composition analysis. SIMS probes the solid surface and thin films by sputtering the surface of the specimen with a focused primary ion beam and collecting and analyzing the ejected secondary ions. The mass/charge ratios of these secondary ions are measured with a mass spectrometer to determine the elemental, isotopic, or molecular composition of the surface to a depth hundreds of nanometers. SIMS is the most sensitive surface analysis technique, with elemental detection limits ranging from parts per million to parts per billion. In some embodiments of the present disclosure, SIMS analysis is conducted on a doped substrate in order to identify the doping profile in the direction perpendicular to the surface of the substrate. In some embodiments, SIMS analyzes a substrate surface to a depth of 1000 nanometers and the doping concentration is measured using a unit of atoms per centimeter cube.

As used herein, "vapor deposition" refers to process of depositing materials on a substrate using a vapor phase of a material to be deposited or a precursor of the material. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like.

As used herein, a "patterning" or "patterned" is used in the present disclosure to describe an operation of forming a predetermined pattern on a surface. The patterning operation includes various steps and processes and varies in accordance with features of embodiments. In some embodiments, a patterning operation patterns an existing film or layer. The patterning operation includes forming a mask on the existing film or layer and removing the unmasked portion of the film or layer with an etch or other removal process. The mask is a photo resist or a hardmask. In some embodiments, a patterning operation directly forms a patterned layer on a surface. The patterning operation includes forming a photosensitive film on the surface, conducting a photolithography process and a developing process. The remaining photosensitive film may be removed or retained and integrated into the package.

As used herein, "photoresist" refers to a general term including a positive photoresist and a negative photoresist. The image of the positive photoresist is the same as the image on the mask or reticle, and the image of negative photoresist is the reversed image of the mask or reticle. In some embodiments of the present disclosure, a positive photoresist is used to achieve sufficient resolution required for the submicron feature size.

As used herein, "filling" or "filled" is used in the present disclosure to describe an operation of force-fed materials in a recess. The filling operation includes various steps and processes and varies in accordance with features of embodiments. In some embodiments, a filling operation includes forming a second photoresist in an opening of a first photoresist via a spin coating operation.

Referring to FIG. 1, a semiconductor structure 100 is provided. The semiconductor structure 100 includes a substrate 101 having a top surface 101A. In some embodiments, the substrate 101 is a P-type silicon wafer. However, other semiconductor wafers such as an N-type silicon wafer, a III-V compound semiconductor wafer, a semiconductor-on-insulator (SOI) substrate, and other construction including semiconductor materials are encompassed within the contemplated scope of the present disclosure. In some embodiments, the layer 103 over the substrate 101 is a P-type silicon epitaxial layer. In other embodiments, the layer 103 is a buried silicon oxides layer. A first doped region and a second doped region are formed in the substrate 101.

Figure 3:
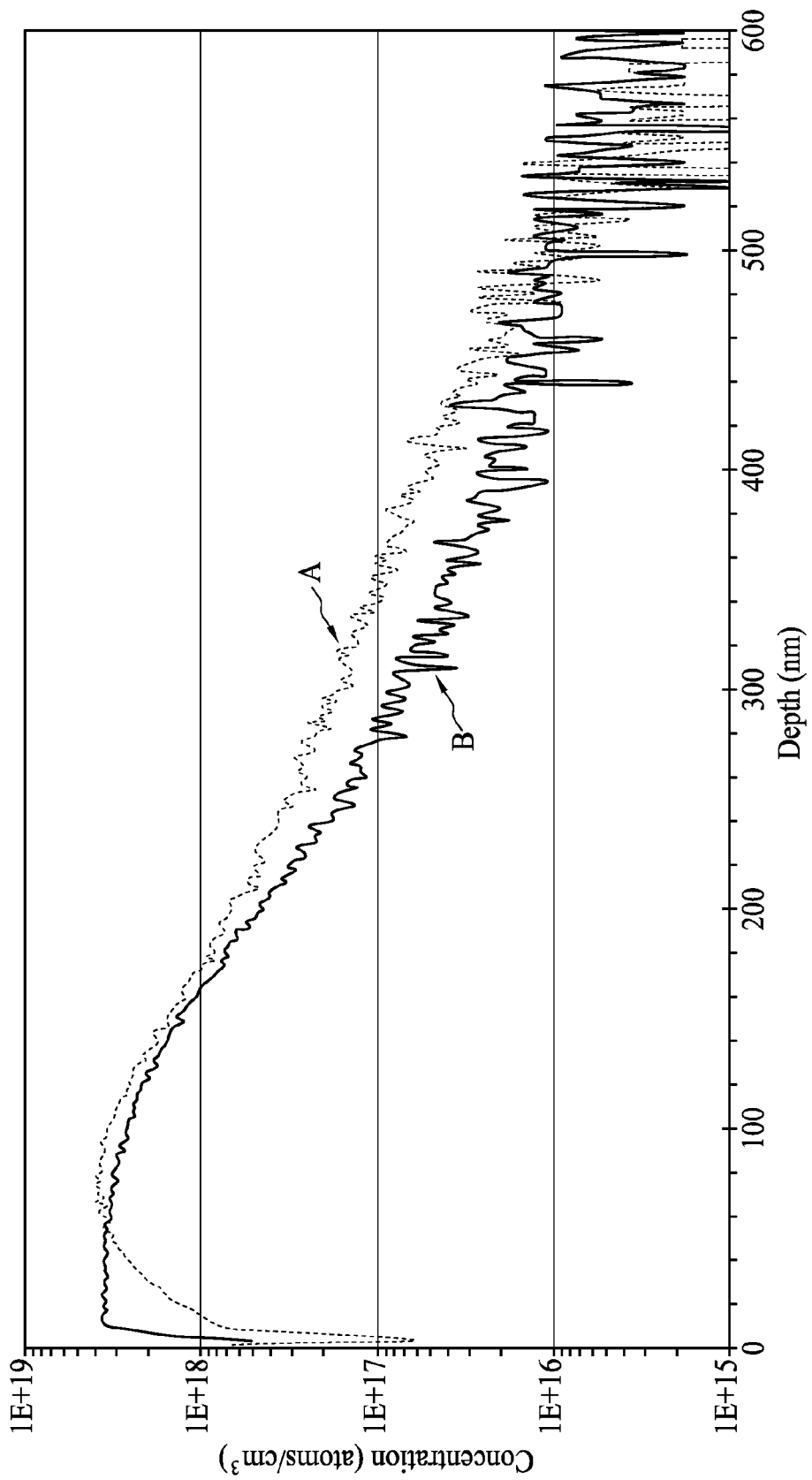
FIG. 3 is a SIMS diagram showing a doping concentration depth profile according to some embodiments of the present disclosure.

In some embodiments, as shown in FIG. 1, the first doped region is a P-well 111 having a first conductivity type (P), and the P-well 111 has a top surface 111A coplanar with the top surface 101A of the substrate 101. On the other hand, the second doped region is an N-well 121 having a second conductivity type (N), and the N-well 121 has a top surface 121A coplanar with the top surface 101A of the substrate 101. The P-well 111 and the N-well 121 shown in FIG. 1 have a monotonically decreasing doping profile starting from the top surface 101A of the substrate 101 to the bottom of the N-well 121 and the P-well 111, respectively. In some embodiments, the semiconductor structure 100 is a CMOS structure having an NMOS and a PMOS structure therein. The monotonically decreasing doping profile is depicted in FIG. 3 and discussed in the later paragraphs of the present disclosure.

In some embodiments, as shown in FIG. 1, the first doped region is a threshold voltage ($V_T$) adjustment region 115 having a first conductivity type (P), and the $V_T$ adjustment region 115 has a top surface 111A coplanar with the top surface 101A of the substrate 101. On the other hand, the second doped region is a threshold voltage ($V_T$) adjustment region 125 having a second conductivity type (N), and the $V_T$ adjustment region 125 has a top surface 121A coplanar with the top surface 101A of the substrate 101. The $V_T$ adjustment regions 115 and 125 shown in FIG. 1 have a monotonically decreasing doping profile starting from the top surface 101A of the substrate 101 to the bottom of the $V_T$ adjustment region 115 and the $V_T$ adjustment region 125, respectively. In some embodiments, the semiconductor structure 100 is a CMOS structure having an NMOS and a PMOS structure therein. The monotonically decreasing doping profile is depicted in FIG. 3 and discussed in the later paragraphs of the present disclosure.

In some embodiments, as shown in FIG. 1, the first doped region is a first lightly doped drain (LDD) 127 having a first conductivity type (P), collectively a "PLDD"; and the PLDD 127 has a top surface 111A coplanar with the top surface 101A of the substrate 101. On the other hand, the second doped region is an LDD 117 having a second conductivity type (N), collectively an "NLDD"; and the NLDD 117 has a top surface 121A coplanar with the top surface 101A of the substrate 101. The PLDD 127 and the NLDD 117 shown in FIG. 1 have a monotonically decreasing doping profile starting from the top surface 101A of the substrate 101 to the bottom of the NLDD 117 and the PLDD 127, respectively. In some embodiments, the semiconductor structure 100 is a CMOS structure having an NMOS and a PMOS structure therein. The monotonically decreasing doping profile is depicted in FIG. 3 and discussed in the later paragraphs of the present disclosure.

An insulating structure 105B is between the first doped region and the second doped region, and other insulating structures 105A are surrounding both the first doped region and the second doped region. In some embodiments, the insulating structure 105B is selected from undoped silicate glass (USG), silicon nitride, silicon oxide, silicon oxynitride, and the combination thereof. In some embodiments, the insulating structure 105A is a shallow trench isolation. A gate 113 is positioned on the P-well 111, surrounded by a spacer 113A. A source 119 and a drain 119 in the P-well 111 are self-aligned under the projection of the spacer 113A-surrounded gate 113. Similarly, a gate 123 is positioned on the N-well 121, and surrounded by a spacer 123A. A source 129 and a drain 129 in the N-well 121 are self-aligned under the projection of the spacer 123A-surrounded gate 123.

Figure 2:
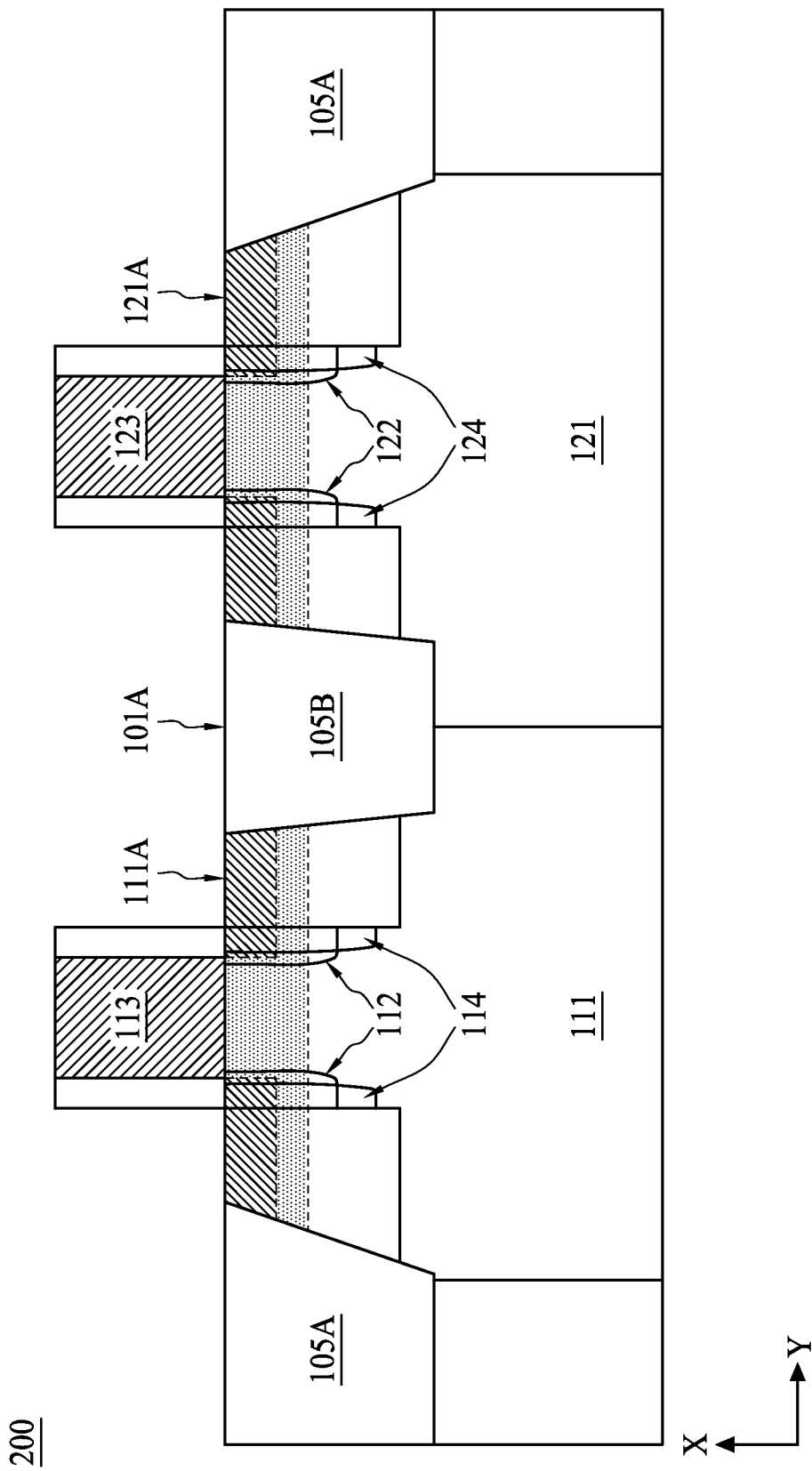
FIG. 2 is an enlarged view of a cross section of a semiconductor structure according to some embodiments of the present disclosure.

Referring to FIG. 2, a semiconductor structure 200 is provided. The semiconductor structure 200 is an enlarged view showing the NMOS and PMOS structure in FIG. 1. Elements with same labeling numbers as those in FIG. 1 are previously discussed with reference thereto and are not repeated here for simplicity. In some embodiments, as shown in FIG. 2, the first doped region is a pocket 112 (or a halo region) having a first conductivity type (P), collectively a "P-pocket" 112, and the P-pocket 112 has a top surface 111A coplanar with the top surface 101A of the substrate 101. On the other hand, the second doped region is a pocket 122 (or a halo region) having a second conductivity type (N), collectively an "N-pocket" 122, and the N-pocket 122 has a top surface 121A coplanar with the top surface 101A of the substrate 101.

The P-pocket 112 and the N-pocket 122 shown in FIG. 2 have a monotonically decreasing doping profile starting from the top surface 101A of the substrate 101 to the bottom of the N-pocket 122 and the P-pocket 112, respectively. The monotonically decreasing doping profile is depicted in FIG. 3 and discussed in the later paragraphs of the present disclosure. The P-pocket 112 and the N-pocket 122 include the same conductivity type as the respective well region they situated in, but featuring a higher dopant level than the well region, reducing the extent of depletion region when compared to depletion regions formed at the junction of the non-pocket structures. The overall effect of the pocket region is to decrease the punch through current.

In other embodiments, as shown in FIG. 2, the first doped region is a deep pocket 114 having a first conductivity type (P), collectively a "deep P-pocket" 114, and the deep P-pocket 114 has a top surface 111A coplanar with the top surface 101A of the substrate 101. On the other hand, the second doped region is a deep pocket 124 having a second conductivity type (N), collectively a "deep N-pocket" 124, and the deep N-pocket 124 has a top surface 121A coplanar with the top surface 101A of the substrate 101. The deep P-pocket 114 and the deep N-pocket 124 shown in FIG. 2 have a monotonically decreasing doping profile starting from the top surface 101A of the substrate 101 to the bottom of the deep N-pocket 124 and the deep P-pocket 114, respectively.

Referring to FIG. 3, a SIMS profile is shown to demonstrate the monotonically decreasing doping profile. A horizontal axis of the SIMS profile shows a depth of the substrate, wherein the 0 depth represents the top surface 101A of the substrate 101 as shown in FIGS. 1 and 2. A vertical axis of the SIMS profile shows dopant concentration. Two curves A and B are shown in FIG. 3. Curve A is a SIMS profile measured from a semiconductor structure manufactured using conventional implantation method, whereas curve B is a SIMS profile measured from a semiconductor structure manufactured using any of the implantation method described herein. Both curves A and B demonstrate Gaussian distribution, in which dopant concentrations normally distributed throughout the depth of the substrate. However, several discrepancies between curve A and curve B can be identified as follows:

(1) Curve A demonstrates both an increasing and a decreasing trend of the dopant concentration, while curve B only shows a decreasing feature. Therefore, curve B possesses a "monotonically decreasing" feature starting from the 0 depth position. (2) A projected range of curve A sits around 80 nm below the 0 depth position (i.e., the top surface 101A of the substrate 101 as referred to FIGS. 1 and 2), whereas a maximum of curve B is around 20 nm below the 0 depth position. In some embodiments, a maximum of curve B is positioned at the top surface 101A of the substrate 101. In other embodiments, the projected range in curve B is not shown below or at the 0 depth position, in other words, the dopant junction depth of the semiconductor structure manufactured using the method described herein is well above the top surface 101A of the substrate 101. In some embodiments, such dopant junction depth is situated in a mask layer which is overlaid on top of the top surface 101A of the substrate 101 during an implantation operation but being stripped after the completion of the doping profile defining operation.

Curves A and B shown in FIG. 3 demonstrate a good fit until 250 nm below the 0 depth position. Critical doping profile regions such as PLDD, NLDD, and $V_T$ adjustment region are shallow doping profile within said 250 nm depth range, hence the implantation method discussed herein and those in the conventional art obtain a highly similar doping profile.

Figure 4A:
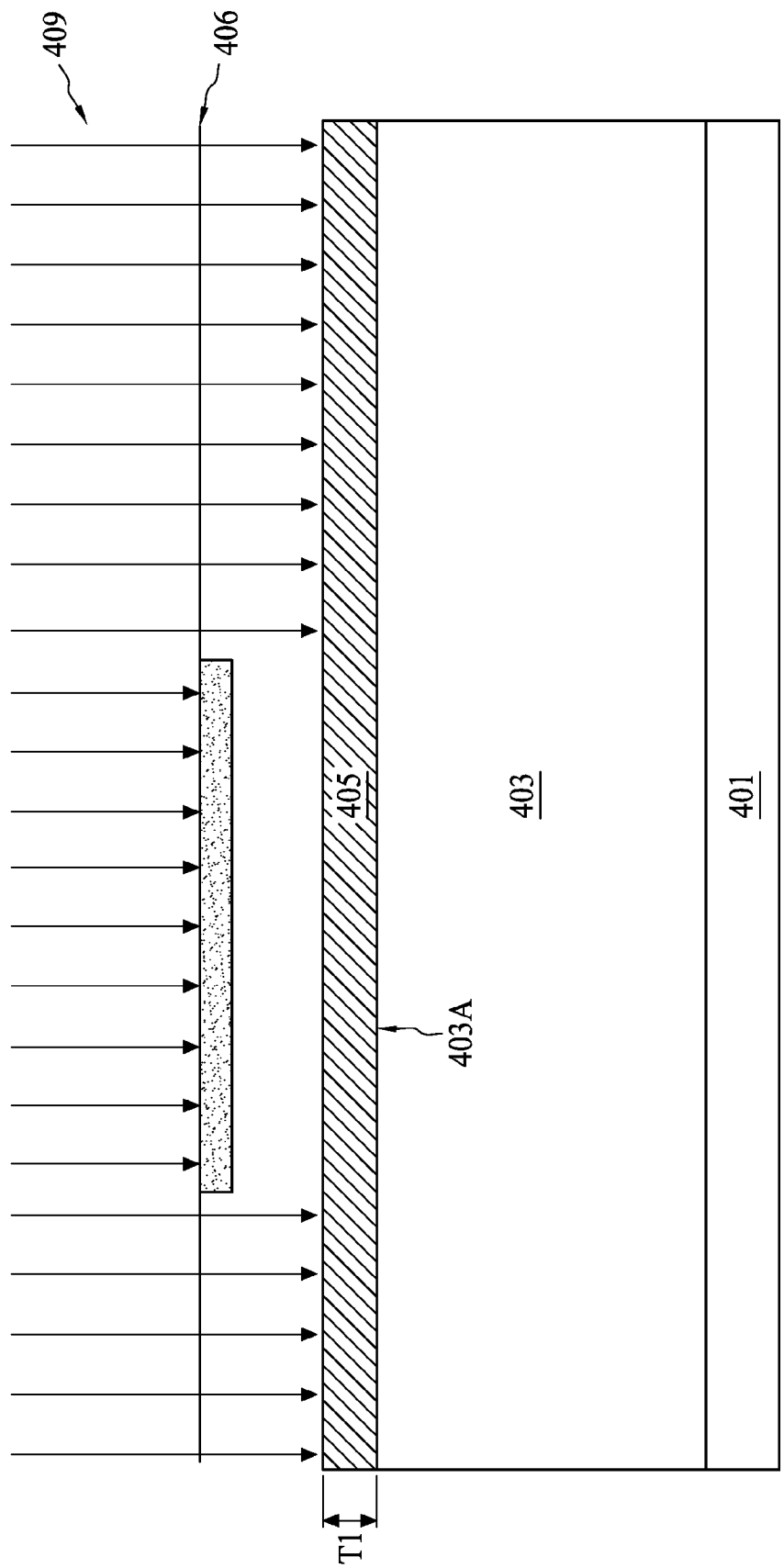

FIG. 4A to FIG. 4E show a method for manufacturing a semiconductor structure with a P-well and an N-well. Referring to FIG. 4A, in some embodiments, a P-doped silicon epitaxial layer 403 is grown on a P-type silicon substrate 401. A first mask layer 405 is formed on a top surface 403A of the epitaxial layer 403. The first mask layer 405 includes materials capable of enduring subsequent ion bombardments. In some embodiments, the first mask layer 405 is a non-organic material selected from USG, silicon nitride, silicon oxynitride, silicon oxide, and the combination thereof. In other embodiments, the first mask layer 405 is a polymer-based material such as photoresist. FIG. 4A shows a patterning operation on the first mask layer 405 using a photolithography, wherein the first mask layer 405 in certain embodiments is a photoresist layer. For example, the photoresist layer is a positive photoresist, and hence a portion covered by a pattern of a reticle 406 that is free from a first radiation 409 exposure stays after a development operation.

In some embodiments, the photoresist for the first mask layer 405 is DUV (deep ultraviolet photoresist of TOPCO® with a thickness T1 of from about 3800 A to about 4500 A. However, the photoresist suitable for the method described herein is not limited to the species previously discussed. Any photoresist that is sensitive to wavelength such as i-line (365 nm), DUV (248 nm to 157 nm), extreme ultraviolet (EUV) or soft X-ray (1 nm-50 nm), X-ray (less than 5 nm), or is sensitive to electrons or ions are suitable materials for the first mask layer 405. The thickness T1 of the photoresist for the first mask layer 405 is about 30% thinner than the photoresist for the first mask layer used in conventional art. The thinner photoresist for the first mask layer 405 reduces the time spent on dynamic dispense and spin coating, and hence the wafer-per-hour (WPH) throughput is increased.

Referring to FIG. 4B, a first doped region 411 is defined through an opening 405' of the photoresist of the first mask layer 405. In some embodiments, the first doped region 411 is an N well, and the phosphorous ion beam 419 is penetrating through the top surface 403A of the epitaxial layer 403 at a phosphorous ion energy of 300 keV and a dosage of 1E13 ions/cm$^2$. However, the implantation condition is not limited to those previously discussed and can be adjusted to suit different dopants and doping profiles, as long as the thickness T1 and the selection of the photoresist of the first mask layer 405 is sustainable during the ion bombardment defining the first doped region 411 and ensuring the region covered thereunder free from ion contamination.

Figure 4C:
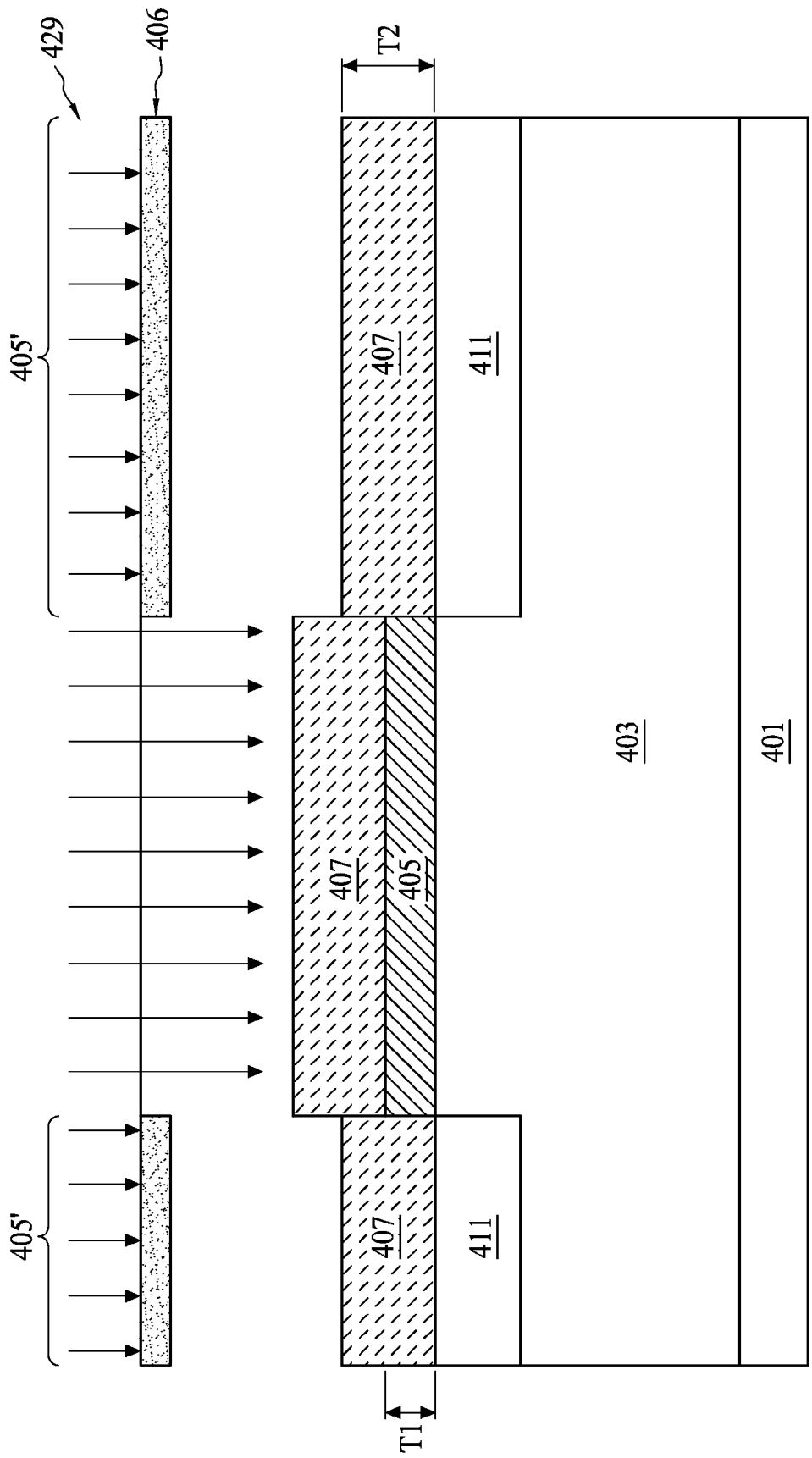

Referring to FIG. 4C, the first mask layer 405 shown in FIG. 4B is not removed, and a second mask layer 407 with a thickness T2 is formed on the first mask layer 405, as well as filling the opening 405' of the first mask layer 405. Because the first mask layer 405 is buried under the second mask layer 407, a top surface of the second mask layer 407 is not uniformly flat. In some embodiments, the second mask layer 407 is a photoresist sensitive to a second radiation 429. For example, the photoresist of the second mask layer 407 is a positive photoresist, and hence a portion covered by a pattern of a reticle 406 that is free from the second radiation 429 exposure stays after a development operation.

The photoresist for the second mask layer 407 is 56A6 photoresist of SUMITOMO® with a thickness T2 of from about 5500 A to about 6500 A. However, the photoresist suitable for the method described herein is not limited to the species previously discussed. Any photoresist that is sensitive to wavelength such as i-line (365 nm), DUV (248 nm to 157 nm), extreme ultraviolet (EUV) or soft X-ray (1 nm-50 nm), X-ray (less than 5 nm), or is sensitive to electrons or ions are suitable materials for the first mask layer 405. In some embodiments, the thickness T2 of the photoresist for the second mask layer 407 is about 50% greater than the thickness T1 of the photoresist for the first mask layer 405. In certain embodiments, the types of the photoresist for the first mask layer 405 and the second mask layer 407 are the same. In other embodiment, the types of the photoresist for the first mask layer 405 and the second mask layer 407 are different. However, the resistance to an ion bombardment in the second mask layer 407 is greater than the resistance to the ion bombardment in the first mask layer 405.

Figure 4D:
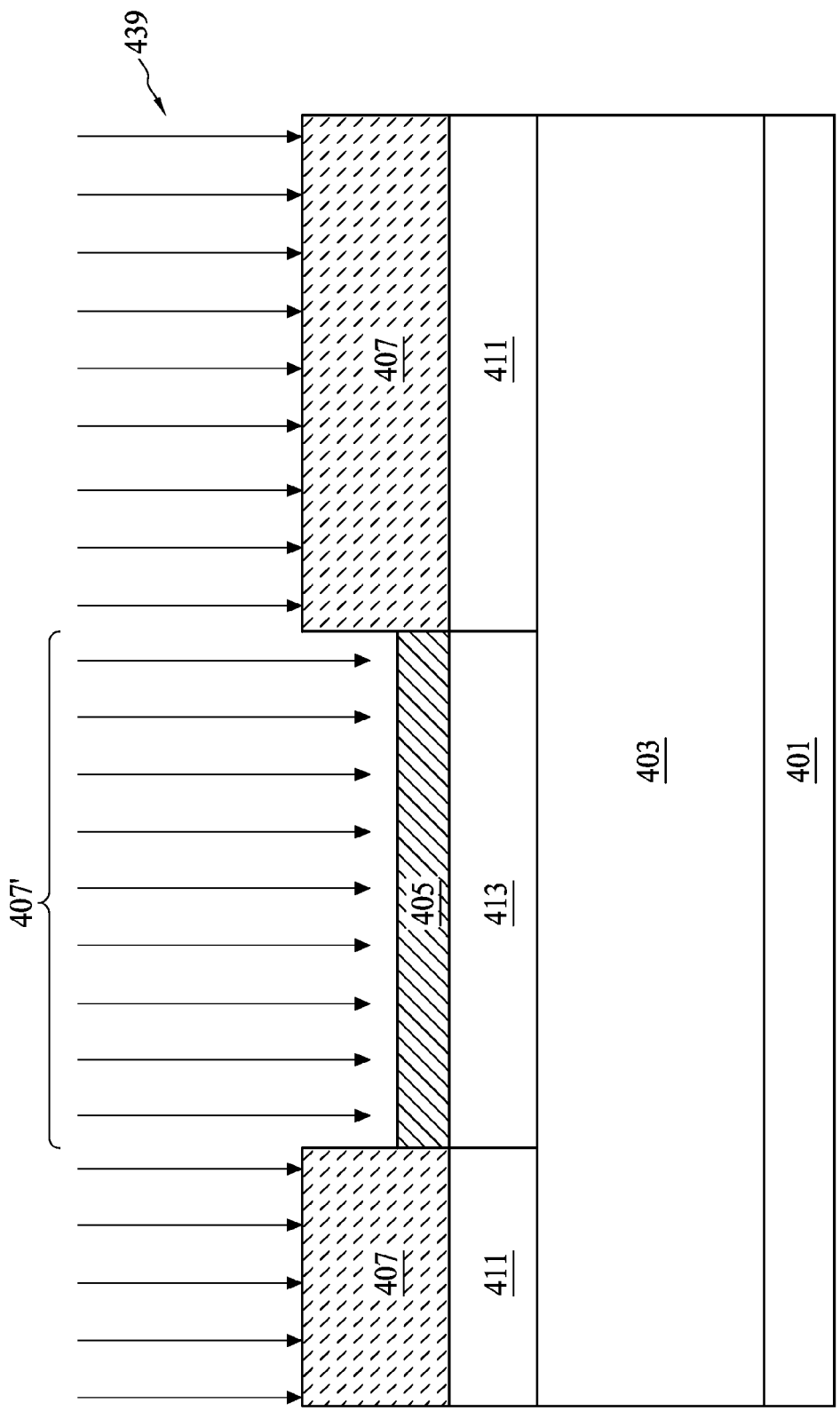

Referring to FIG. 4D, a second doped region 413 is defined through an opening 407' of the photoresist of the second mask layer 407. In some embodiments, the second doped region 413 is a P well, and a boron ion beam 439 is penetrating through the top surface 403A of the epitaxial layer 403 at boron ion energy of 230 keV and a dosage of 3E13 ions/cm$^2$. However, the implantation condition is not limited to those previously discussed and can be adjusted to suit different dopants and doping profiles, as long as the thickness T2 and the selection of the photoresist of the second mask layer 407 is sustainable during the ion bombardment defining the second doped region 413 and ensuring the region covered thereunder free from ion contamination.

In some embodiments, the implantation condition such as the ion accelerating voltage (doping ion energy) for the second doped region 413 is greater than the ion accelerating voltage used for the first doped region 411 by about 400% to about 600%. However, the ion accelerating voltage difference between the operation defining the first doped region 411 and the second doped region 413 does not have to be in the range discussed previously. The accelerating voltage difference shall be sufficient for a substantial portion of the accelerated ions defining the second doped region 413 to penetrate the first mask layer 405 and enter the epitaxial layer 403.

Figure 4E:
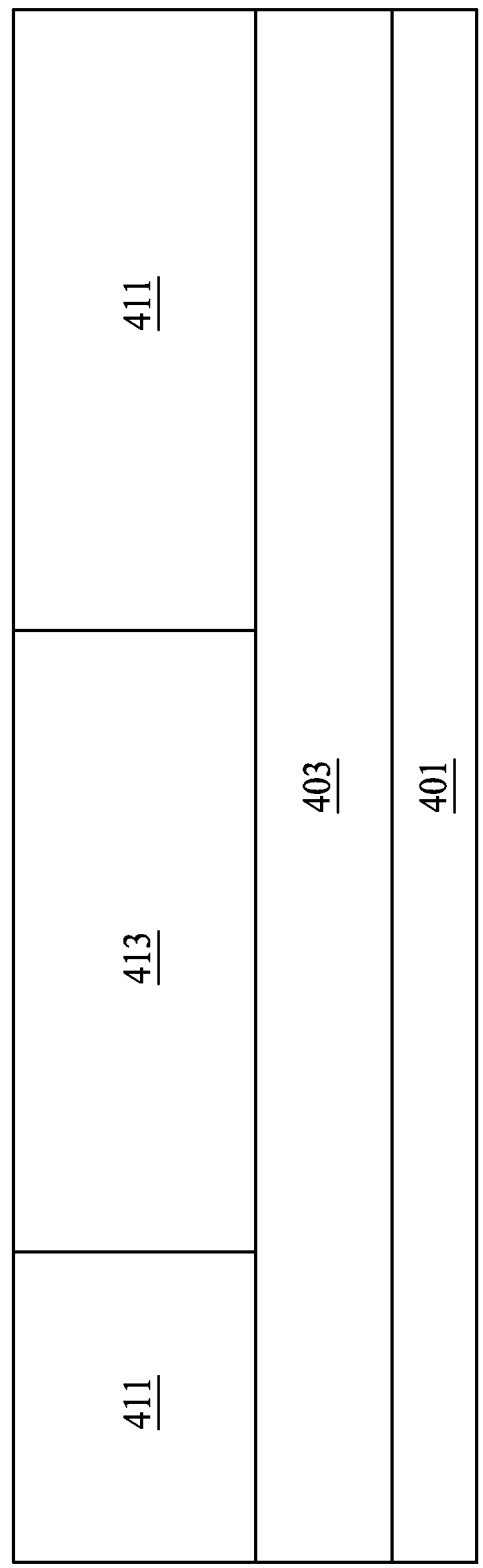

Referring to FIG. 4E, the first mask layer 405 and the second mask layer 407 are stripped from the epitaxial layer 403, leaving a defined first doped region 411 and a defined second doped region 413. In some embodiments, the stripping operation includes a PR dry etch, a PR wet etch, or both a PR dry etch and a PR wet etch. The PR wet etch and PR dry etch are previously discussed in the present disclosure and are not repeated here for simplicity. In FIG. 4E, an RTA operation is implemented for driving-in the as-doped impurities, and hence the profiles of the first doped region 411 and the second doped region 413 are broader than the as-doped profile.

FIG. 5A to FIG. 5E show a method for manufacturing a semiconductor structure using a pre-gate implantation, in other words, the implantation is conducted prior to a gate structure of the semiconductor structure is formed. In some embodiments, the semiconductor structure is a CMOS including an NMOS and a PMOS. The implantation operation illustrated in FIG. 5A to FIG. 5E forms two doped regions in a $V_T$ adjustment region in the NMOS and a $V_T$ adjustment region in the PMOS, respectively. Other pre-gate implantation at least includes an N-well and a P-well formation. Elements with same labeling numbers as those in FIG. 4A to FIG. 4E are previously discussed with reference thereto and are not repeated here for simplicity.

Figure 5A:
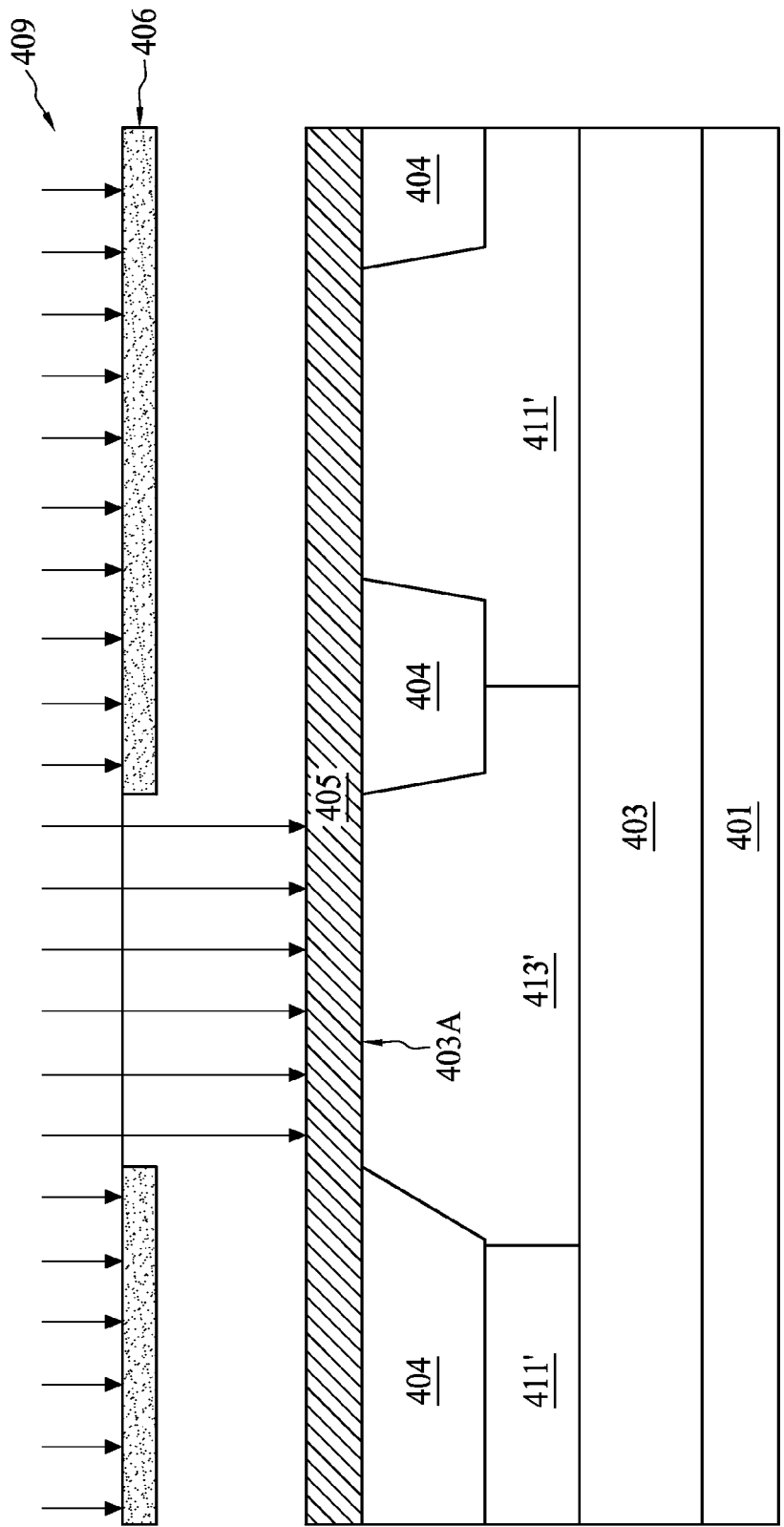
FIG. 5A to FIG. 5E are a method for manufacturing a semiconductor structure with a threshold voltage ($V_T$) adjustment region in an N-well and a P-well according to some embodiments of the present disclosure; and FIG. 6A to FIG. 6E is a method for manufacturing a semiconductor structure with a PLDD and an NLDD according to some embodiments of the present disclosure.
Figure 5B:
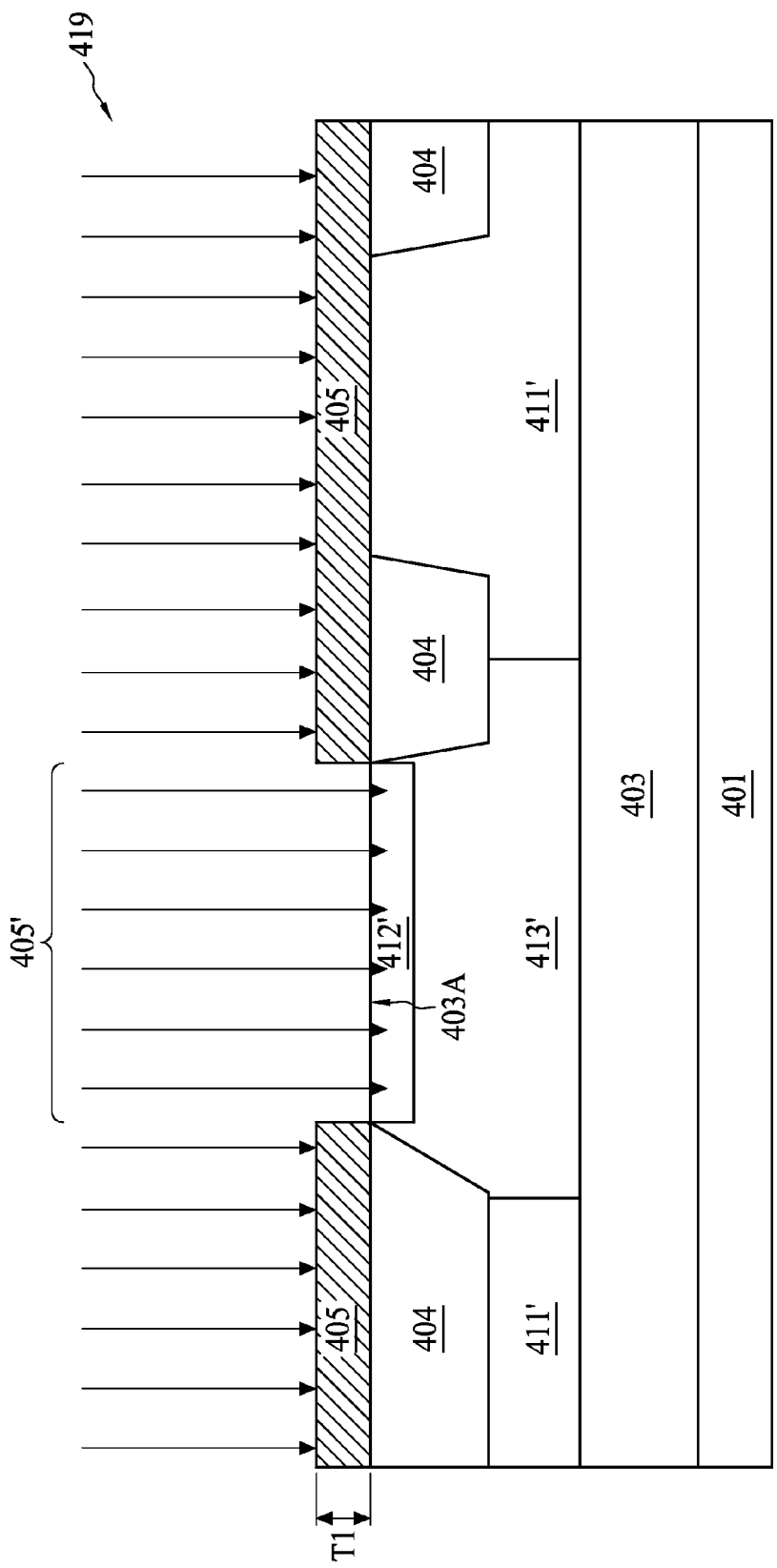

Referring to FIG. 5A, a first mask layer 405 is formed on the top surface 403A of the epitaxial layer 403, covering an N-well 411', a P-well 413', and the isolating structure 404. No gate structure is formed before or during the manufacturing method described in the embodiments from FIG. 5A to FIG. 5E. In some embodiments, the first mask layer 405 is a positive photoresist such that a portion covered by a pattern of the reticle 406 that is free from the first radiation 409 exposure stays after a development operation. In FIG. 5B, a first doped region 412 of a first conductivity type (P) is defined in the P-well 413' through the opening 405' of the photoresist of the first mask layer 405. In some embodiments, the defining of the first doped region 412 is a low-energy, low-dosage implantation process in a $V_T$ adjustment region.

Figure 5C:
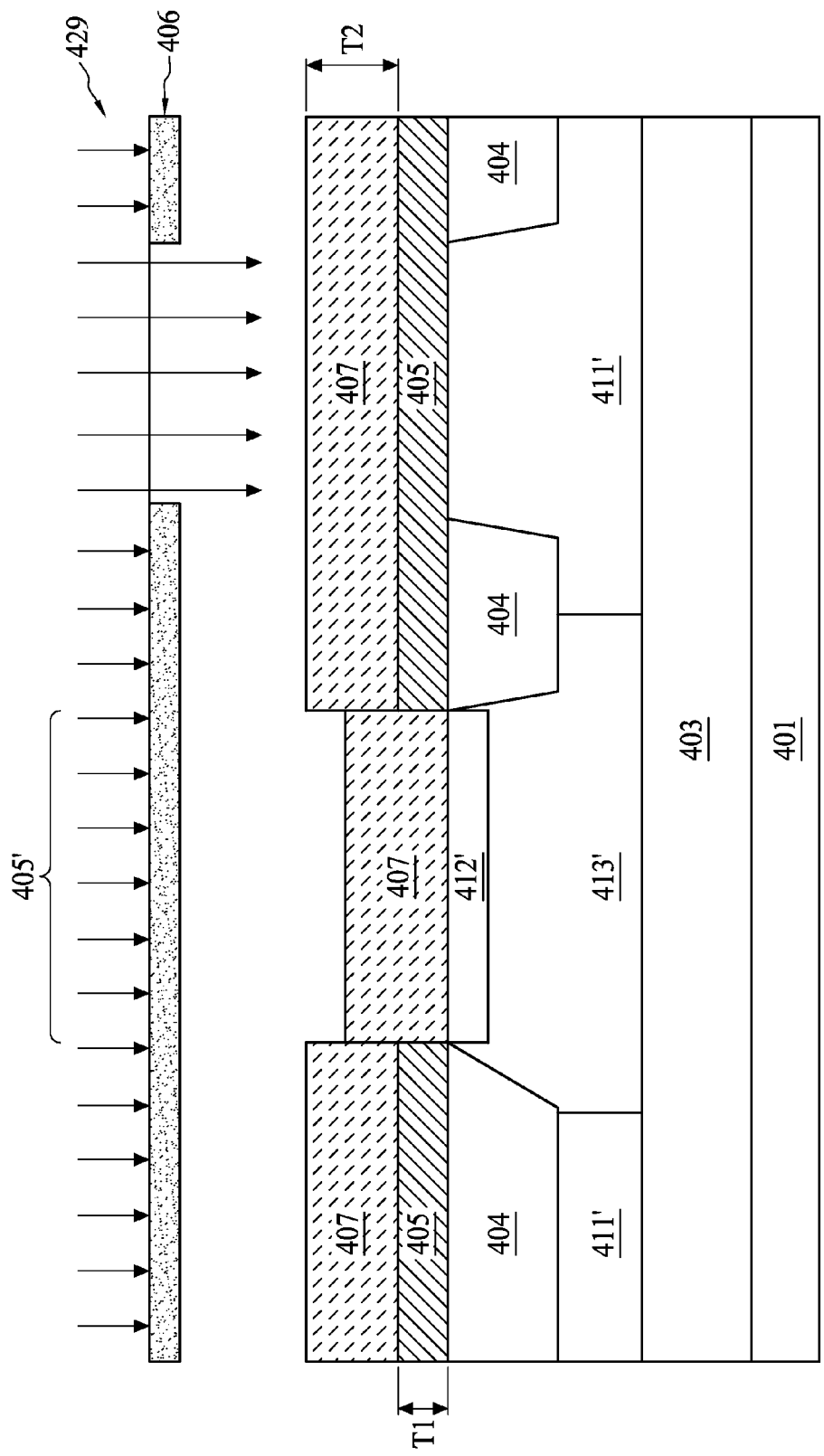

In some embodiments as shown in FIG. 5B, boron (B) ion beams 419 are penetrating through the top surface 403A of the epitaxial layer 403 at a boron ion energy of 2 keV and a dosage of 4E12 ions/cm$^2$. In some embodiments, the photoresist of the first mask layer 405 is DUV photoresist of TOPCOe® with a thickness T1 of from about 3500 A to about 4500 A. However, the photoresist suitable for the method described herein is not limited to the species previously discussed. In FIG. 5C, a second mask layer 407 with a thickness T2 is formed over the first mask layer 405, filling the opening 405' of the first mask layer 405. Because the first mask layer 405 is not removed before the formation of the second mask layer 407, a top surface of the second mask layer 407 is not uniformly flat. In some embodiments, the second mask layer 407 is a positive photoresist such that a portion covered by a pattern of the reticle 406 that is free from the second radiation 429 exposure stays after a development operation. In certain embodiments, the thickness T2 of the second mask layer 407 is greater than the thickness T1 of the first mask layer 405 by 50%.

Figure 5D:
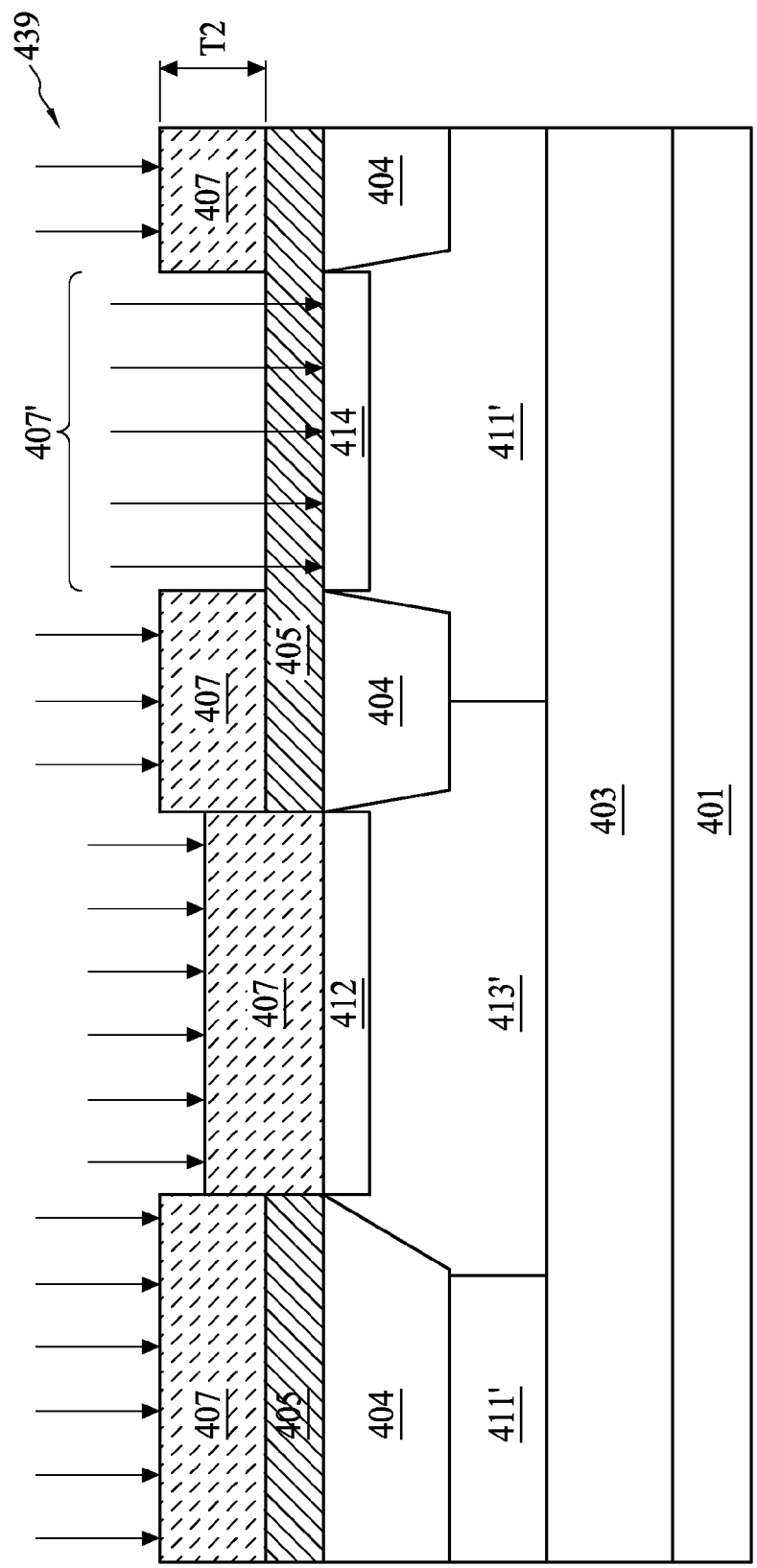

In FIG. 5D, a second doped region 414 of a second conductivity type (N) is defined in the N-well 411' through the opening 407' of the photoresist of the second mask layer 407. In some embodiments as shown in FIG. 5D, arsenic (As) ion beams 439 are penetrating through the top surface 403A of the epitaxial layer 403 at an arsenic ion energy of 10 keV and a dosage of 4E12 ions/cm$^2$. However, in other embodiments, boron (B) ion beams are used as dopants to form the $V_T$ adjustment region in the N-well 411'. In some embodiments, the photoresist of the second mask layer 407 is 56A6 photoresist of SUMITOMO® with a thickness T2 of from about 5500 A to about 6500 A. Because the defining of the first doped region 412 and the defining of the second doped region 414 are sequential without an interruption of a photoresist stripping operation, the first doped region 412 and the second doped region 414 are defined in a consecutive manner.

In certain embodiments, the types of the photoresist for the first mask layer 405 and the second mask layer 407 are the same. In other embodiment, the types of the photoresist for the first mask layer 405 and the second mask layer 407 are different. However, the resistance to an ion bombardment in the second mask layer 407 is greater than the resistance to the ion bombardment in the first mask layer 405.

In some embodiments as shown in FIG. 5D, the implantation condition such as the arsenic ion accelerating voltage (doping ion energy) for the second doped region 414 is greater than the boron ion accelerating voltage used for the first doped region 412 by about 400% to about 600%. However, the ion accelerating voltage difference between the operation defining the first doped region 412 and the second doped region 414 does not have to be in the range discussed previously. The accelerating voltage difference shall be sufficient for a substantial portion of the accelerated ions defining the second doped region 414 to penetrate the first mask layer 405 and enter the N-well 411'.

Figure 5E:
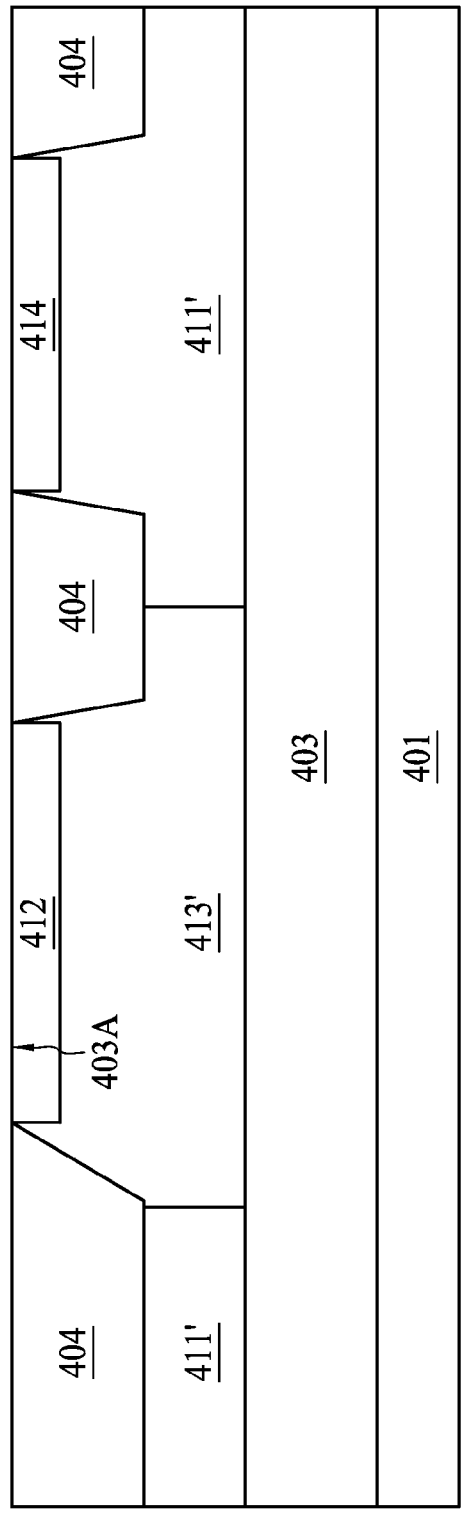

Referring to FIG. 5E, the first mask layer 405 and the second mask layer 407 are stripped from the top surface 403A of the epitaxial layer 403, leaving a defined first doped region 412 in the P-well 413' and a defined second doped region 414 in the N-well 411'. In some embodiments, the stripping operation includes a PR dry etch, a PR wet etch, or both a PR dry etch and a PR wet etch. The PR wet etch and PR dry etch are previously discussed in the present disclosure and are not repeated here for simplicity.

FIG. 6A to FIG. 6E show a method for manufacturing a semiconductor structure using a post-gate implantation. In other words, the implantation is conducted after a gate structure of the semiconductor structure is formed. In some embodiments, the semiconductor structure is a CMOS including an NMOS and a PMOS. The implantation operation illustrated in FIG. 6A to FIG. 6E forms two doped regions of opposite conductive types, self-aligned under a gate structure in the NMOS and the PMOS, respectively. Other post-gate implantation at least includes an N-pocket, a deep N-pocket, a P-pocket, and a deep P-pocket formation. Elements with same labeling numbers as those in FIG. 5A to FIG. 5E are previously discussed with reference thereto and are not repeated here for simplicity.

Figure 6A:
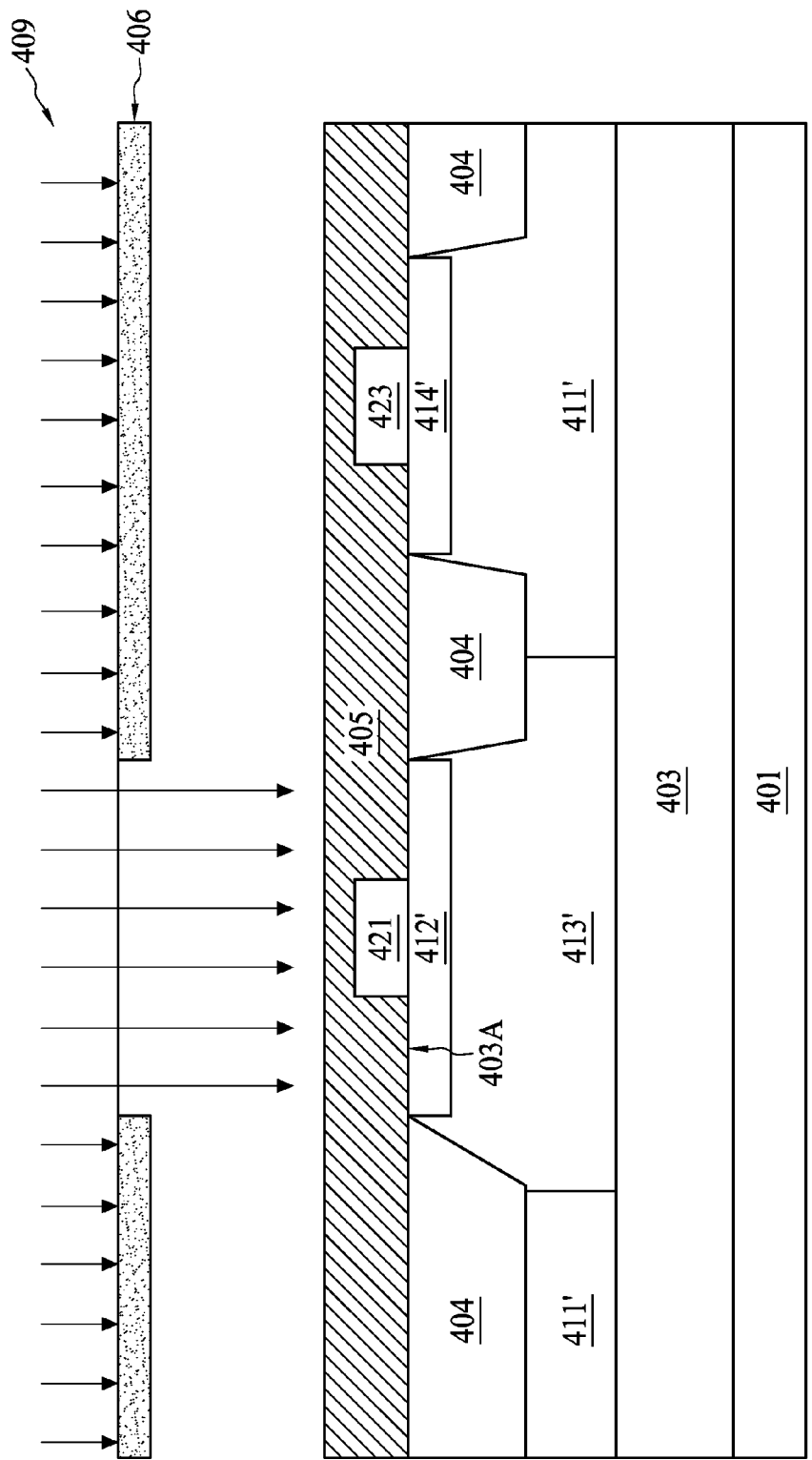

Referring to FIG. 6A, an NMOS gate 421 is formed on the top surface 403A of an $V_T$ adjustment region 412', and a PMOS gate 423 is formed on the top surface 403A of the $V_T$ adjustment region 414'. In some embodiments, the NMOS gate 421 and the PMOS gate 423 are formed by vapor deposition or thermal growth of polysilicon material. The post-gate implantation forms a self-aligned doping profile under the gate, wherein the gate serves as a hard mask and hence the region shadowed by the NMOS gate 421 and the PMOS gate 423 are not affected by the implantation operation.

In some embodiments as shown in FIG. 6A, the first mask layer 405 is a positive photoresist such that a portion covered by a pattern of the reticle 406 that is free from the first radiation 409 exposure stays after a development operation.

Figure 6B:
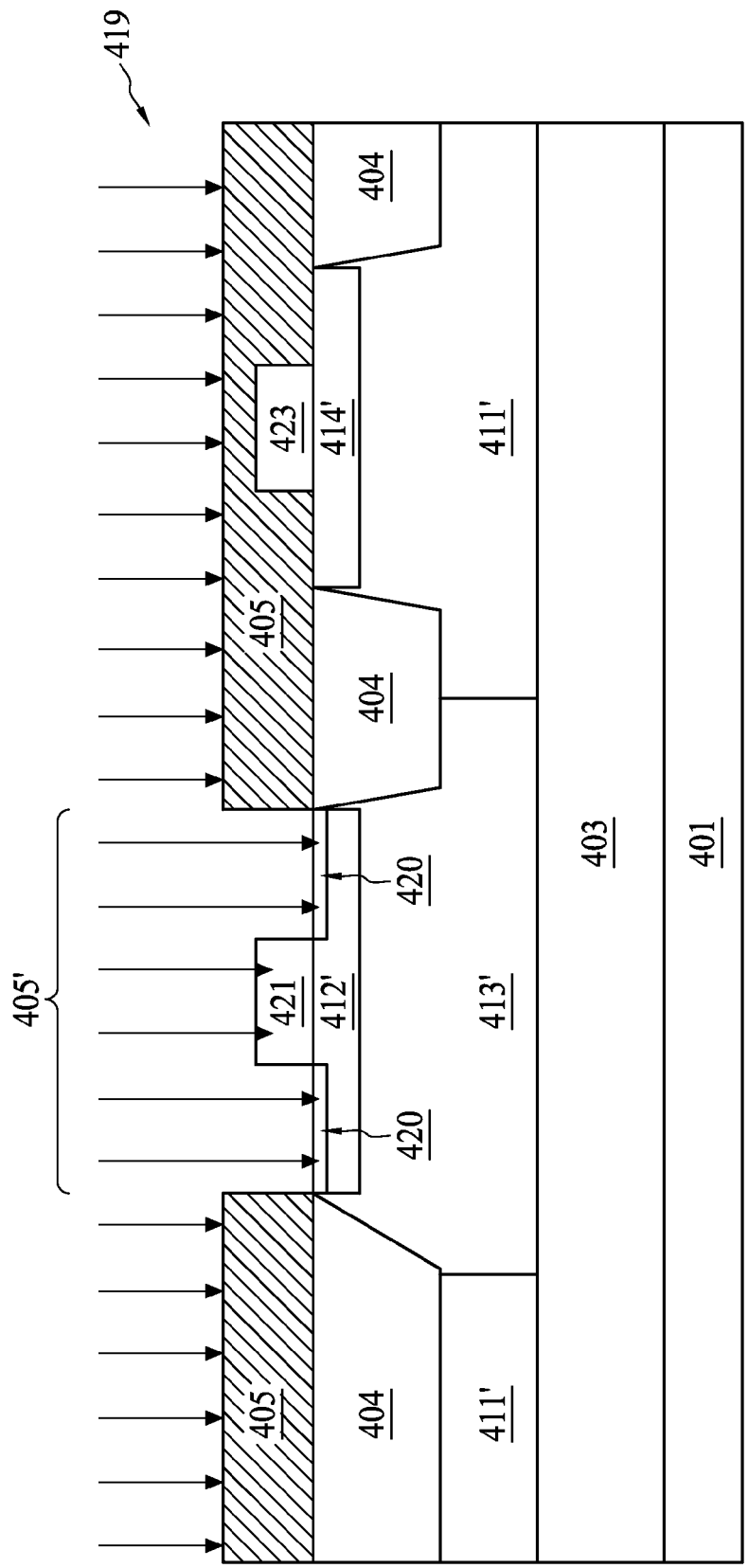

In FIG. 6B, a first doped region 420 of a first conductivity type (N) is defined in the P-well 413' through the opening 405' of the photoresist of the first mask layer 405. In some embodiments, the defining of the first doped region 420 is a low-energy, mid-dosage implantation process. In certain embodiments, the low-energy, mid-dosage implantation is an N-doped lightly doped drain (NLDD).

Figure 6C:
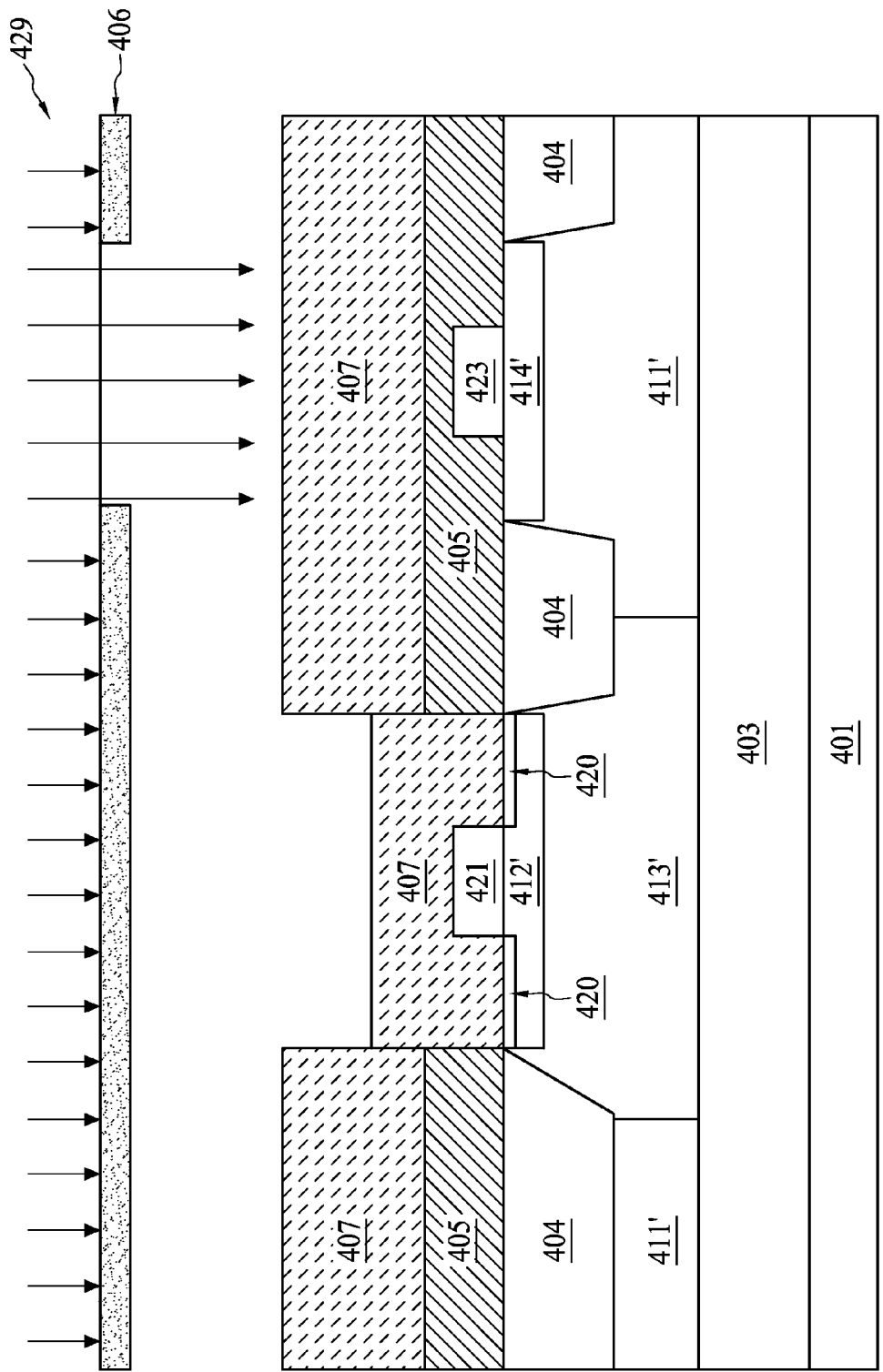

In some embodiments as shown in FIG. 6B, phosphorous ion beams 419 are penetrating through the top surface 403A of the P-well 413' at a phosphorous ion energy of 40 keV and a dosage of 4E13 ions/cm². In some embodiments, the photoresist of the first mask layer 405 is DUV photoresist of TOPCOme® with a thickness T1 of from about 3500 A to about 4500 A. However, the photoresist suitable for the method described herein is not limited to the species previously discussed. In FIG. 6C, a second mask layer 407 with a thickness T2 is formed over the first mask layer 405, filling the opening 405' of the first mask layer 405. Because the first mask layer 405 is not removed before the formation of the second mask layer 407, a top surface of the second mask layer 407 is not uniformly flat. In some embodiments, the second mask layer 407 is a positive photoresist such that a portion covered by a pattern of the reticle 406 from the second radiation 429 exposure stays after a development operation. In certain embodiments, the thickness T2 of the second mask layer 407 is greater than the thickness T1 of the first mask layer 405 by 50%.

Figure 6D:
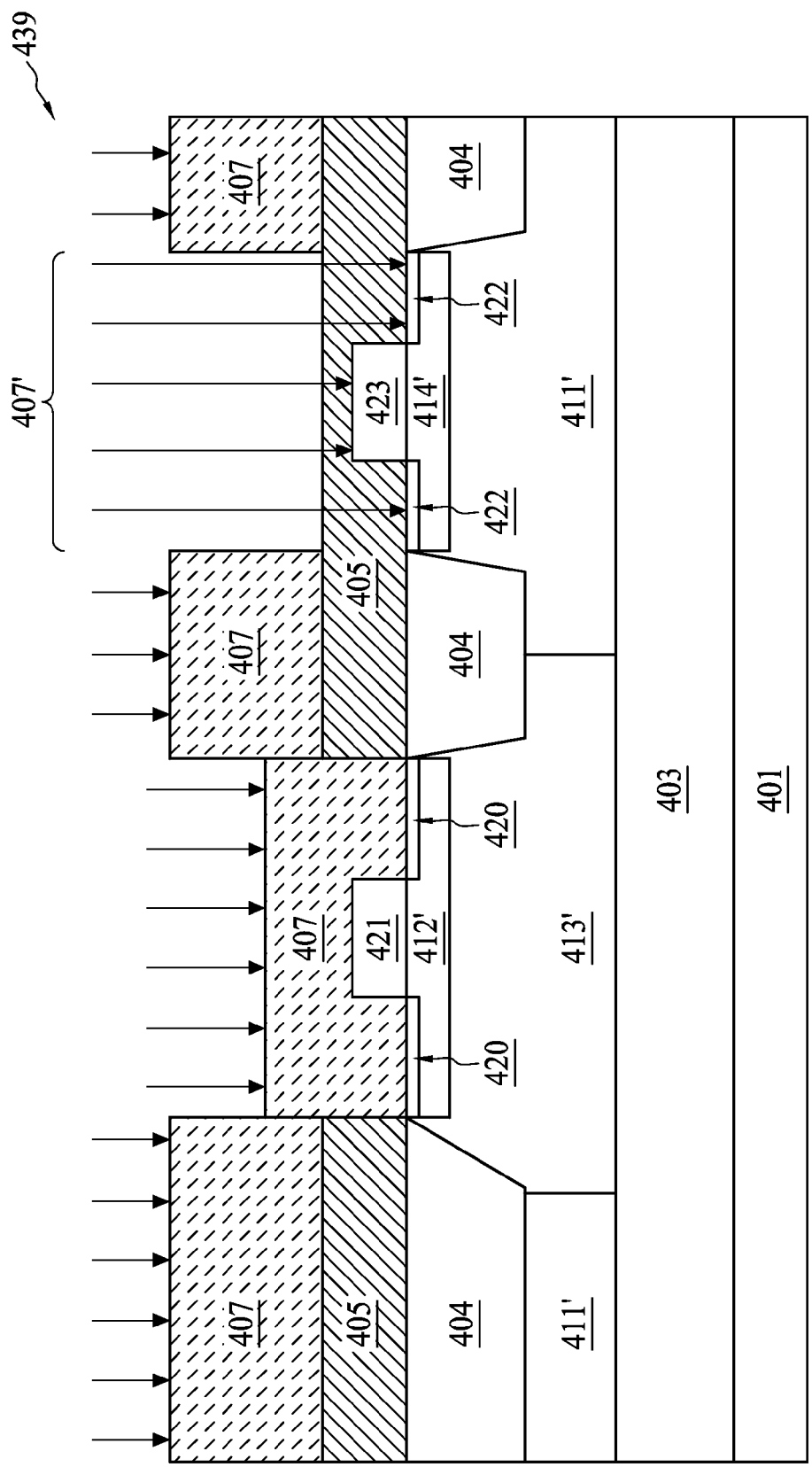

In FIG. 6D, a second doped region 422 of a second conductivity type (P) is defined in the N-well 411' through the opening 407' of the photoresist of the second mask layer 407. In some embodiments as shown in FIG. 6D, the boron ion beams 439 are penetrating through the top surface 403A of the N-well 411' at a boron ion energy of 230 keV and a dosage of 7.5E13 ions/cm² to form a PLDD. In some embodiments, the photoresist of the second mask layer 407 is 56A6 photoresist of SUMITOMO® with a thickness T2 of from about 5500 A to about 6500 A. Because the defining of the first doped region 420 and the defining of the second doped region 422 are sequential without an interruption of a photoresist stripping operation, the first doped region 420 and the second doped region 422 are defined in a consecutive manner.

In certain embodiments, the types of the photoresist for the first mask layer 405 and the second mask layer 407 are the same. In other embodiment, the types of the photoresist for the first mask layer 405 and the second mask layer 407 are different. However, the resistance to an ion bombardment in the second mask layer 407 is greater than the resistance to the ion bombardment in the first mask layer 405.

In some embodiments as shown in FIG. 6D, the implantation condition such as the boron ion accelerating voltage (doping ion energy) for the second doped region 422 is greater than the phosphorous ion accelerating voltage used for the first doped region 420 by about 400% to about 600%. However, the ion accelerating voltage difference between the operation defining the first doped region 420 and the second doped region 422 does not have to be in the range discussed previously. The accelerating voltage difference shall be sufficient for a substantial portion of the accelerated ions defining the second doped region 422 to penetrate the first mask layer 405 and enter the N-well 411'.

Figure 6E:
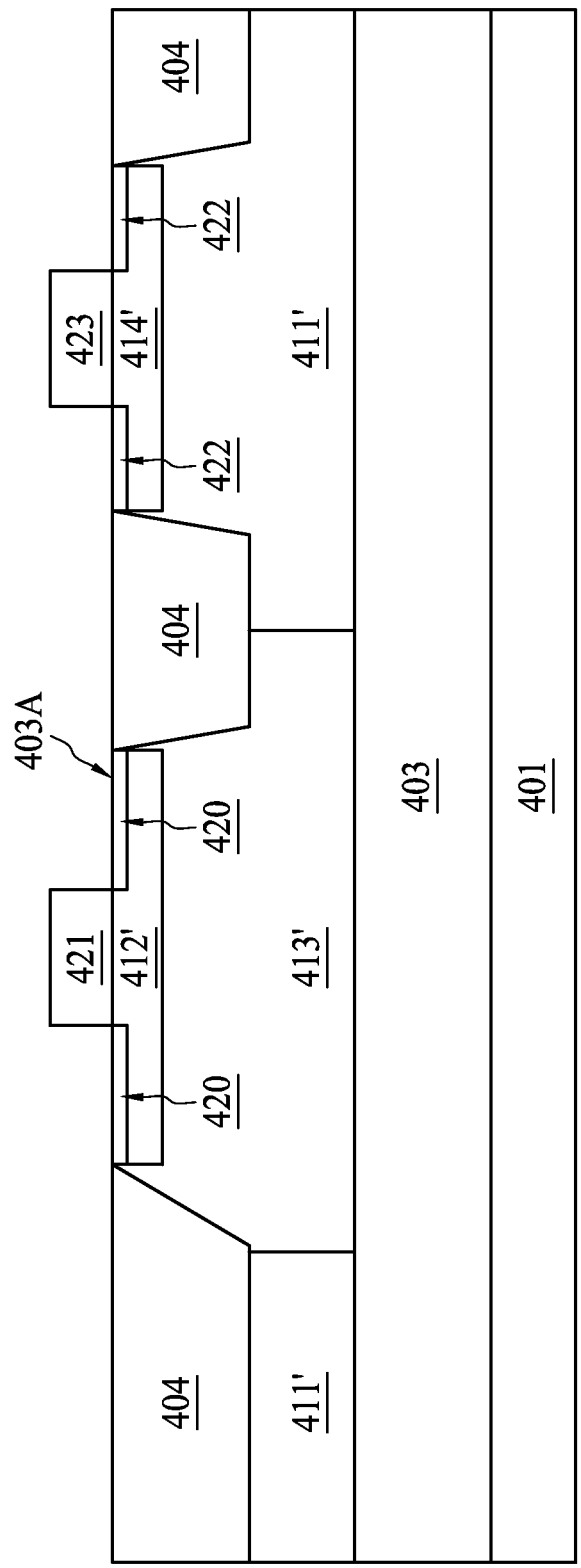

Referring to FIG. 6E, the first mask layer 405 and the second mask layer 407 are stripped from the top surface 403A of the epitaxial layer 403, leaving a defined NLDD 420 in the P-well 413' and a defined PLDD 422 in the N-well 411'. In some embodiments, the stripping operation includes a PR dry etch, a PR wet etch, or both a PR dry etch and a PR wet etch. The PR wet etch and PR dry etch are previously discussed in the present disclosure and are not repeated here for simplicity.

Some embodiments of the present disclosure provide a semiconductor structure. The semiconductor structure includes a substrate having a top surface; a first doped region in the substrate, having a first conductivity type and a first surface; and a second doped region in the substrate, having a second conductivity type and a second surface. The first surface is coplanar with the top surface of the substrate, and the second surface is coplanar with the top surface of the substrate. The first doped region and the second doped region have a monotonically decreasing doping profile from the top surface of the substrate to a bottom of the first doped region or a bottom of the second doped region.

In some embodiments of the present disclosure, a projected range of the doping profile has a maximum at the top surface of the substrate.

In some embodiments of the present disclosure, the semiconductor structure is a CMOS comprising an NMOS and a PMOS.

In some embodiments of the present disclosure, the first doped region in a CMOS is a well of the first conductivity type, and the second doped region in the CMOS is a well of the second conductivity type.

In some embodiments of the present disclosure, the first doped region in a CMOS is a $V_T$ adjustment region of the first conductivity type, and the second doped region in the CMOS is a $V_T$ adjustment region of the second conductivity type.

In some embodiments of the present disclosure, the first doped region in a CMOS is a lightly doped drain (LDD) of the first conductivity type, and the second doped region in the CMOS is a lightly doped drain (LDD) of the second conductivity type.

In some embodiments of the present disclosure, the first doped region in a CMOS is an envelope pocket region of the first conductivity type, and the second doped region in the CMOS is an envelope pocket region of the second conductivity type.

Some embodiments of the present disclosure provide a method of manufacturing a semiconductor structure. The method includes forming a first mask on a substrate; defining a first doped region through an opening of the first mask; forming a second mask on the first mask and filling in the opening of the first mask with the second mask; defining a second doped region through an opening of the second mask; and stripping the first mask and the second mask from the substrate.

In some embodiments of the present disclosure, the forming the first mask on the substrate and forming the second mask on the first mask and filling in the opening of the first mask with the second mask, a thickness of the first mask is thinner than a thickness of the second mask.

In some embodiments of the present disclosure, the forming the first mask on the substrate and forming the second mask on the first mask and filling in the opening of the first mask with the second mask include forming a first photoresist on the substrate and forming a second photoresist on the first photoresist and filling in an opening of the first photoresist with the second photoresist.

In some embodiments of the present disclosure, the first photoresist and the second photoresist are made of different materials.

In some embodiments of the present disclosure, defining the first doped region through the opening of the first mask and defining the second doped region through the opening of the second mask includes ion implantation operations.

In some embodiments of the present disclosure, a dosage for defining the first doped region and the second doped region is lower than 1E14 atoms/cm$^2$.

In some embodiments of the present disclosure, an ion accelerating voltage for defining the second doped region is greater than an ion accelerating voltage for defining the first doped region.

In some embodiments of the present disclosure, wherein the ion accelerating voltage for defining the second doped region is configured to penetrate the first mask and define the second doped region.

In some embodiments of the present disclosure, wherein the stripping the first mask and the second mask from the substrate includes a dry stripping operation and a wet stripping operation.

Some embodiments of the present disclosure provide a method of manufacturing a semiconductor structure. The method includes performing a pre-gate implantation by a method described herein; forming a gate on the substrate; and performing a post-gate implantation by the method. The method includes forming a first mask on a substrate; defining a first doped region through an opening of the first mask; forming a second mask on the first mask and filling in the opening of the first mask with the second mask; defining a second doped region through an opening of the second mask; and stripping the first mask and the second mask from the substrate.

In some embodiments of the present disclosure, wherein the first doped region and the second doped region in the pre-gate implantation is defined in a consecutive manner without stripping the first mask.

In some embodiments of the present disclosure, wherein the first doped region and the second doped region in the post-gate implantation is defined in a consecutive manner without stripping the first mask.

In some embodiments of the present disclosure, wherein the pre-gate implantation includes performing an N well implantation in a PMOS and a P well implantation in an NMOS; and performing a threshold voltage adjustment implantation in an N-well of the PMOS and in a P-well of the NMOS.

In some embodiments of the present disclosure, wherein the post-gate implantation includes performing a lightly doped drain (LDD) implantation in an N-well and performing an LDD implantation in a P-well; and performing an envelope pocket implantation in either the N-well or the P-well.

Although the present invention and its advantages have been described in detail, it should be understood that various changes, substitutions and alterations cancan be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor structure, comprising:
   forming a first mask on a substrate;
   defining a first doped region through an opening of the first mask;
   forming a second mask on the first mask and filling in the opening of the first mask with the second mask;
   defining a second doped region through an opening of the second mask, the opening of the second mask simultaneously exposing the underlying first mask; and
   stripping the first mask and the second mask from the substrate.

2. The method in claim 1, wherein forming the first mask on the substrate and forming the second mask on the first mask and filling in the opening of the first mask with the second mask, a thickness of the first mask is thinner than a thickness of the second mask.

3. The method in claim 1, wherein forming the first mask on the substrate and forming the second mask on the first mask and filling in the opening of the first mask with the second mask comprise forming a first photoresist on the substrate and forming a second photoresist on the first photoresist and filling in an opening of the first photoresist with the second photoresist.

4. The method in claim 3, wherein the first photoresist and the second photoresist are made of different materials.

5. The method in claim 1, wherein defining the first doped region through the opening of the first mask and defining the second doped region through the opening of the second mask comprise ion implantation operations.

6. The method in claim 5, a dosage for defining the first doped region and the second doped region is lower than 1E14 atoms/cm$^2$.

7. The method in claim 5, an ion accelerating voltage for defining the second doped region is greater than an ion accelerating voltage for defining the first doped region.

8. The method in claim 7, wherein the ion accelerating voltage for defining the second doped region is configured to penetrate the first mask and define the second doped region.

9. The method in claim 1, wherein the stripping the first mask and the second mask from the substrate comprises a dry stripping operation and a wet stripping operation.

10. A method of manufacturing a CMOS, comprising:
    performing a pre-gate implantation by a sequence of operations, the sequence of operations comprising:
      forming a first mask on a substrate;
      defining a first doped region through an opening of the first mask;
      forming a second mask on the first mask and filling in the opening of the first mask with the second mask;
      defining a second doped region through an opening of the second mask exposing the underlying first mask; and
      stripping the first mask and the second mask from the substrate;
    forming a gate on the substrate; and
    performing a post-gate implantation by a sequence of operations, the sequence of operations comprising:
      forming a third mask on the substrate;
      defining a third doped region through an opening of the third mask;
      forming a fourth mask on the third mask and filling in the opening of the third mask with the fourth mask;

defining a fourth doped region through an opening of the fourth mask exposing the underlying third mask; and stripping the third mask and the fourth mask from the substrate.

11. The method in claim 10, wherein the first doped region and the second doped region in the pre-gate implantation is defined in a consecutive manner before the stripping the first mask and the second mask from the substrate.

12. The method in claim 10, wherein the third doped region and the fourth doped region in the post-gate implantation is defined in a consecutive manner before the stripping the third mask and the fourth mask from the substrate.

13. The method in claim 10, wherein the pre-gate implantation comprises performing an N well implantation in a PMOS and a P well implantation in an NMOS; and performing a threshold voltage adjustment implantation in a P-well of the NMOS and in an N-well of the PMOS.

14. The method in claim 10, wherein the post-gate implantation comprises performing a lightly doped drain (LDD) implantation in an N-well and performing an LDD implantation in a P-well; and performing an envelope pocket implantation in either the N-well or the P-well.

15. A method of manufacturing a semiconductor structure, comprising:

forming a first mask on the substrate;

defining a first doped region through a first opening of the first mask;

forming a second mask on the first mask and filling in the first opening of the first mask with the second mask;

defining a second doped region by penetrating through a portion of the first mask exposed by a second opening of the second mask; and stripping the first mask and the second mask from the substrate, wherein the first opening and the second opening project on different regions of the substrate.

16. The method in claim 15, wherein the defining the second doped region comprises applying an ion accelerating voltage from about 400% to about 600% greater than an ion accelerating voltage applied for defining the first doped region.

17. The method in claim 15, wherein a dosage for defining the first doped region or the second doped region is lower than 1E14 atoms/cm$^2$.

18. The method in claim 15, wherein the forming the first doped region comprises implanting the first doped region with dopants of a first conductivity type, and the forming the second doped region comprises implanting the second doped region with dopants of a second conductivity type.

19. The method in claim 15, wherein the forming the first mask and the forming the second mask comprises forming a first photoresist layer of the first mask having a thickness about 50% less than a thickness of a second photoresist layer of the second mask.

20. The method in claim 15, wherein the forming the second mask comprises forming a photoresist layer with a thickness of from about 5500 A to about 6500 A.

* * * * *